US008873781B2

(12) United States Patent
Hannemann et al.

(10) Patent No.: US 8,873,781 B2
(45) Date of Patent: Oct. 28, 2014

(54) METHOD FOR OPERATING A HEARING DEVICE HAVING REDUCED COMB FILTER PERCEPTION AND HEARING DEVICE HAVING REDUCED COMB FILTER PERCEPTION

(75) Inventors: Ronny Hannemann, Buckenhof (DE); Sebastian Pape, Erlangen (DE)

(73) Assignee: Siemens Medical Instruments Pte. Ltd., Singapore (SG)

( * ) Notice: Subject to any disclaimer, the term of this patent is extended or adjusted under 35 U.S.C. 154(b) by 269 days.

(21) Appl. No.: 13/459,437

(22) Filed: Apr. 30, 2012

(65) Prior Publication Data

US 2012/0275630 A1 Nov. 1, 2012

(30) Foreign Application Priority Data

Apr. 29, 2011 (DE) ......................... 10 2011 075 006

(51) Int. Cl.

*H04R 25/00* (2006.01)
*H03G 3/20* (2006.01)
*H04R 1/40* (2006.01)
*H04R 5/033* (2006.01)
*H04S 7/00* (2006.01)

(52) U.S. Cl.

CPC .............. *H04R 5/033* (2013.01); *H04R 25/305* (2013.01); *H04S 7/303* (2013.01); *H04R 25/45* (2013.01)
USPC ................................ 381/320; 381/58; 381/97

(58) Field of Classification Search

CPC ...... H04R 25/30; H04R 25/305; H04R 25/45; H04R 25/453; H04S 7/303
USPC .............. 381/58, 97, 320; 600/25; 607/56, 57
See application file for complete search history.

(56) References Cited

U.S. PATENT DOCUMENTS 7,522,738 B2 * 4/2009 Miller, III ..................... 381/318
2006/0045294 A1 * 3/2006 Smyth ............................. 381/74
2007/0032886 A1 * 2/2007 Tsai ................................ 700/17
2009/0046871 A1 * 2/2009 Oxford et al. ................... 381/98
2009/0058606 A1 * 3/2009 Munch et al. ................... 381/74
2010/0030101 A1 2/2010 Durrant et al.

FOREIGN PATENT DOCUMENTS

DE 102006028682 A1 1/2008
WO 2009149378 A1 12/2009

OTHER PUBLICATIONS

German Office Action, Date Jan. 5, 2012.

* cited by examiner

*Primary Examiner* — Jesse Elbin
(74) *Attorney, Agent, or Firm* — Laurence A. Greenberg; Werner H. Stemer; Ralph E. Locher

(57) ABSTRACT

A method of operating a hearing device monitors for a head movement of a hearing device wearer. When a head movement is detected, an acoustic signal acquired by a microphone is output in an amplified and phase-modulated manner with a receiver. Furthermore, a hearing device includes a motion sensor and a signal processing unit that is configured to execute the method.

11 Claims, 3 Drawing Sheets

METHOD FOR OPERATING A HEARING DEVICE HAVING REDUCED COMB FILTER PERCEPTION AND HEARING DEVICE HAVING REDUCED COMB FILTER PERCEPTION

CROSS-REFERENCE TO RELATED APPLICATION

This application claims the priority, under 35 U.S.C. §119, of German patent application DE 10 2011 075 006.1, filed Apr. 29, 2011; the prior application is herewith incorporated by reference in its entirety.

BACKGROUND OF THE INVENTION

Field of the Invention

The present invention relates to a method for operating a hearing device having reduced comb filter perception. Furthermore, the present invention relates to a hearing device having reduced comb filter perception.

A hearing device is used to supply a hearing-impaired person with acoustic ambient signals, which are processed and amplified to compensate for and/or treat the respective hearing impairment. In principle it includes one or several input converters, a signal processing facility having an amplification facility and/or an amplifier and an output converter. The input converter is generally a receiving transducer, e.g. a microphone, and/or an electromagnetic receiver, e.g. an inductance coil. The output converter is usually implemented as an electroacoustic converter, e.g. a miniature loudspeaker, or as an electromechanical converter, e.g. bone conduction earpiece. It is also referred to as earpiece or receiver. The output converter generates output signals, which are routed to the ear of the patient and generate an auditory perception for the patient. The amplifier is generally integrated in the signal processing unit. The hearing device is supplied with power by means of a battery arranged in the hearing device housing. The primarily important electronic components of a hearing device are generally arranged on a printed circuit board as an interconnect device and/or connected thereto.

Hearing devices in various basic housing configurations are known. With ITE hearing devices (In The Ear) a housing which contains all functional components including microphone and receiver, is for the most part worn in the auditory canal. CiC hearing devices (Completely In Canal) are similar to ITE hearing devices, but are instead worn completely in the auditory canal. With BTE hearing devices (Behind The Ear) a housing with components, such as a battery and signal processing facility, is worn behind the ear and a flexible sound tube, also referred to as tube, routes the acoustic output signals of a receiver from the housing to the auditory canal. RiC BTE hearing devices (Receiver In Canal Behind the Ear) are similar to BTE hearing devices, but the receiver is instead worn in the auditory canal and instead of a sound tube, which routes acoustic signals to an earpiece, a flexible cable, also referred to as receiver tube or receiver connecting means, routes electrical signals to a receiver which is attached to the front of the cable.

Hearing devices generally have an earpiece, which, in the case of a BTE hearing device is arranged at the end of the sound tube, and in the case of a RiC BTE hearing device is arranged close to the receiver and is inserted into the auditory canal. With other housing configurations, the housing or parts thereof may assume the function of the earpiece.

A rough distinction is made between a closed, so-called "close fitting" earpieces and open, so-called "open fitting" earpieces, whereby "open" and "closed" essentially relate to the sound permeability which depends for its part on the material properties and on the mechanical sealing effect of the earpiece.

Open earpieces, which should essentially hold the sound tube or the receiver tube with the receiver centrally in the auditory canal, are generally more pleasant with respect to wearing comfort, since they exert less pressure on the auditory canal and enable an improved ventilation of the auditory canal, known as "venting". Open earpieces are acoustically advantageous in that on account of the possible pressure equalization in the auditory canal, occlusion effects, such as the unnatural sound of the wearer's own voice or chewing noises transmitted by means of solid-borne sound, are prevented.

In addition to the disadvantage of open earpieces, such as the fact that they cannot be used for large amplification factors, i.e. with significant hearing impairments, on account of acoustic feedback effects, so-called comb filter effects can develop during their use. The superimposition of a direct acoustic signal and of the acoustic signal of the hearing device which is delayed by the signal processing facility results in amplifications at specific frequencies and attenuations at other frequencies. In the extreme case, the amplitude doubles at frequencies, the periodic time of which or multiples thereof equate to the delay time, and/or the signals cancel themselves out if the delay time lies precisely between whole number multiples of the periodic time. In the event of a different intensity in terms of direct and amplified signal, the change in the resulting signal is between the said extremes. The perceivable hearing impression upon the occurrence of comb filter effects is a sound discoloration, such as an unnatural, often metallic sound, particularly at lower frequencies.

Usual methods for reducing the perception of comb filter effects are the reduction of the amplification of lower frequencies, i.e. the use of a high pass filter, or the use of closed earpieces. One disadvantage of the first method is that the information content of the wanted signal is restricted by means of the filtering. The use of closed earpieces is disadvantageous in comparison with open earpieces, in terms of poorer wearing comfort and possible occlusion effects.

SUMMARY OF THE INVENTION

It is accordingly an object of the invention to provide a hearing device and a method for operating a hearing device which overcome the above-mentioned disadvantages of the heretofore-known devices and methods of this general type and which provides for an operating method and a hearing device with reduced comb filter perception.

With the foregoing and other objects in view there is provided, in accordance with the invention, a method of operating a hearing device. The method comprises the following method steps:

detecting a head movement of a person wearing the hearing device;

upon detecting the head movement, outputting an acoustic signal acquired with a microphone in amplified and phase-modulated form with a receiver.

In other words, the basic concept behind the invention is a method for operating a hearing device, in which a head movement of a hearing device wearer is detected and in the event of a detected head movement, an acoustic signal detected with a microphone is output in an amplified and phase-modulated fashion with a receiver.

This method uses a natural ability of the human brain to cancel out comb filter effects so that they are not consciously perceivable. In a natural environment, the human is exposed to sound situations during which comb filter effects are likewise formed. If music is output for instance in a space by way of a loud speaker, the sound is reflected from the walls, and reaches the ears of a listener in a time-delayed fashion with respect to direct sound. The comb filters developing in this way can be measured but are however not consciously perceived by the listener. It is assumed here that the human brain is able to integrate sound impressions from both ears over time and in the frequency range and thus to eliminate the same. In addition, the person constantly performs small, sometimes smallest head movements, which result on the one hand in the characteristic, i.e. the amplitude response, of the comb filter varying constantly and on the other hand in the phase position of the acoustic signals, which relate to the right and left ear, varying constantly. By combining the alternating hearing impressions of the two ears and the knowledge about the head movement, the human brain is able to cancel out comb filter effects. If an acoustic signal, which was subjected to a comb filter, is however fed directly to the ear, such as is the case for instance with the use of a hearing device, comb filter effects are audible. The inventive method solves this problem in that the head movement of a hearing device wearer is monitored, for instance by evaluating an output signal of an acceleration sensor, which is arranged on or in the hearing device, and subsequently experiences the same accelerations such as the head. Upon recognition of a head movement, the phase, in other words the delay, of the acoustic signal detected with a microphone and to be output in an amplified fashion varies constantly, i.e. a phase modulation of the hearing device signal takes place. These small variations in the hearing device signal to be output in an amplified fashion simulate the natural effect which enables the human brain to cancel out comb filter effects. In other words, the variations in the phase position of the hearing device signal, which are executed during recognition of head movements, result in a variation in the comb filter characteristic, as a result of which the perception of the comb filter effects is reduced.

In accordance with an added feature of the invention, the novel method for operating a hearing device includes the following:

a) detecting an acoustic signal and detecting a linear and/or rotatory acceleration value of a hearing device;

b) If the linear and/or rotatory acceleration value is greater than a threshold value, applying a phase modulation to the detected acoustic signal;

c) Amplifying the detected acoustic signal and outputting the same via a receiver;

d) If an abort criterion, in particular a specific switching state of a control element at the hearing device is not fulfilled, skip to method step a).

In the first method step, e.g. with a microphone of a hearing device, an acoustic signal and an acceleration value of the hearing device are detected. The detection of the acceleration value can be measured for instance by an acceleration sensor, by means of which linear accelerations can be measured, or by a gyro sensor, by means of which the rotatory movements and accelerations can be measured, whereby the acceleration sensor can be arranged in the hearing device for instance. Accelerations are interpreted as head movements. If the linear and/or rotatory acceleration value is greater than a threshold value, the detected acoustic signal is exposed to a phase modulation, in other words the output of the acoustic signal in a subsequent method step is delayed. In the case of a linear acceleration sensor, the threshold value can be specified in the unit $m/s^2$, in the case of a rotatory acceleration sensor, in the unit $°/s^2$. The threshold value is favorably obtained by a series of measurements with test persons, whereby the threshold value corresponds to the average value from the acceleration sensor signals for instance, in which the test persons are instructed to keep their head still. In the next method step, the detected acoustic signal is amplified and output via a receiver of the hearing device when taking into account the phase modulated in the preceding method step. If an abort criterion is not fulfilled, a skip to the first method step is made. The abort criterion may be the switching state "off" of an on/off switch on the hearing device for instance.

In accordance with a preferred embodiment of the invention, the modulated phase is modulated by a noise function.

The change in the phase is non-correlated by a noise function, i.e. a function with a broad non-specific frequency spectrum. The term jitter may also be used.

The modulated phase is favorably modulated between 0 and 10 ms and, in another embodiment, between 0 and 15 ms.

In an advantageous development, there is a positive correlation between the amplitude of the phase modulation and the output signal of the motion sensor.

In this context, a positive correlation signifies that a large output signal of the motion sensor brings about a large amplitude of the phase modulation.

With a binaural supply of a hearing device wearer, the method is preferably executed in the individual hearing devices independently of one another.

The hearing situation of a human is herewith simulated without a hearing device, in which, with head movements, direct sound and reflected sound strike the ears of the receiver in an almost non-correlated fashion.

With the above and other objects in view there is also provided, in accordance with the invention, a hearing device, comprising:

a hearing device housing, at least one microphone for acquiring a sound signal, a receiver for outputting a sound signal, an earpiece, a power supply unit, and a signal processing unit connected to receive the sound signal from said at least one microphone;

at least one motion sensor connected to said signal processing unit and configured to detect a head movement of a wearer of the hearing device; and said signal processing unit including means for modulating a phase of an acoustic signal, said modulating means, when a head movement of the wearer of the hearing device is detected, modulating the signal acquired by the microphone, and said signal processing unit amplifying the sound signal and outputting with said receiver.

In other words, a further basic idea behind the invention is a hearing device having a hearing device housing, at least one microphone, a receiver, an earpiece, a power supply unit and a signal processing unit, which includes at least one motion sensor, which is connected to the signal processing unit, whereby head movements of the hearing device wearer can be detected by the motion sensor and whereby the signal processing unit includes means in order to modulate the phase of an acoustic signal which, upon detection of head movements of the hearing device wearer, can be detected by the microphone and amplified by the signal processing unit and output by the receiver.

Aside from components such as the hearing device housing, microphone, receiver, earpiece, power supply unit and signal processing unit, the inventive hearing device includes at least one motion sensor as a further component, which can detect head movements of the hearing device wearer, and can forward the same to the signal processing unit in the form of measurement signals. The signal processing unit, such as an electronic computer or microcontroller, receives the signals of the motion sensor and is able to modulate the phase of the acoustic signals detected with the aid of the microphone.

The signal processing unit of the hearing device preferably includes means for executing one of the afore-described methods.

Electronic, digital computers are included to this end which can execute the programs with digital signal processing steps.

In an advantageous embodiment of the inventive hearing device, the motion sensor includes at least one acceleration sensor and/or at least one gyro sensor.

An acceleration sensor measures the acceleration by determining the inertia force acting on a test mass. In practice, miniaturized sensors are frequently used, the measuring principles of which are based on piezoelectric effects. Other acceleration sensors are embodied as so-called microelectromechanical systems, MEMS. They are available in versions for measuring linear accelerations or measuring angular accelerations.

In a further advantageous embodiment of the inventive hearing device, the motion sensor includes at least two acceleration sensors and/or at least two gyro sensors, which are arranged in non-parallel axes, in particular in axes aligned orthogonally relative to one another.

Two or more acceleration sensors, which can also represent components of an acceleration sensor component, allow the measurement of acceleration vectors in a two or three-dimensional space. The prerequisite here is that the measuring direction of the acceleration sensors is not parallel. In order to measure a spatial acceleration vector, it is favorable to align the measuring directions orthogonally to one another. The same applies to the measurement of angular acceleration vectors in a two or three-dimensional space.

Other features which are considered as characteristic for the invention are set forth in the appended claims.

Although the invention is illustrated and described herein as embodied in a Method for operating a hearing device having reduced comb filter perception and hearing device having reduced comb filter perception, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
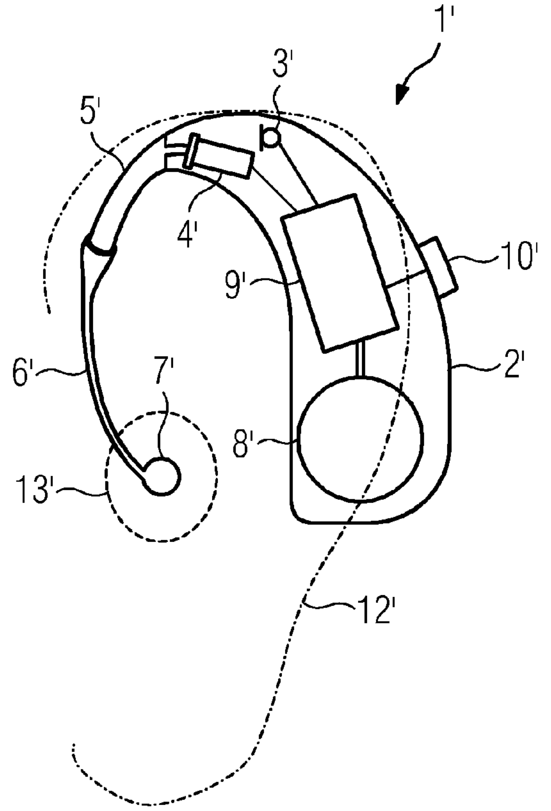
FIG 1 PRIOR ART
FIG. 1 shows a schematic view of an exemplary embodiment of a hearing device according to the prior art.

Referring now to the figures of the drawing in detail and first, particularly, to FIG. 1 thereof, there is shown a schematic representation of a behind-the-ear hearing device 1' according to the prior art. The device includes a housing 2' to be worn behind the auricle 12' of a hearing device wearer having a hearing device wearing hook 5'. A microphone 3', a battery 8' and a receiver 4' are arranged in the housing 2 aside from electronic components which are combined to form a signal processing unit 9'. The acoustic signal generated by the receiver 5' is routed through the hearing device wearing hook 5' and a sound tube 6 to an earpiece 7' which is inserted into an auditory canal 13' of the hearing device wearer. A control element 10', e.g. an on/off switch or an operating mode regulator, is arranged on the hearing device housing 2' which is connected to the signal processing unit 9'.

Figure 2:
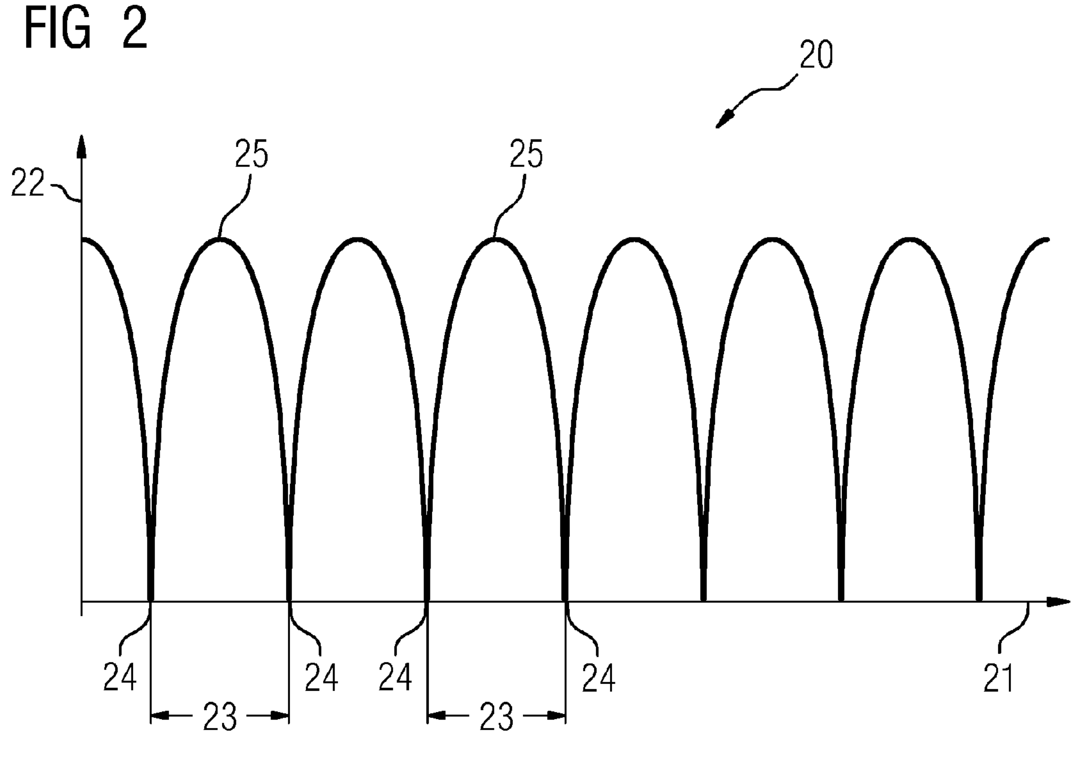
FIG. 2 is graph showing an example of a frequency response of the amplitude of a comb filter.

FIG. 2 shows an example of a frequency response 20 of a comb filter. It shows the course of the amplitude 22, e.g. in decibels, above the frequency 21, e.g. in hertz. The filter frequencies 24, also known as notches, which appear in multiples and have the same frequency separation 23, are characteristic of a comb filter. The amplification increases to a maximum 25 between the filter frequencies 24 so that the comb-shaped amplitude curve 20, which has given the name to this filter, is produced.

Figure 3:
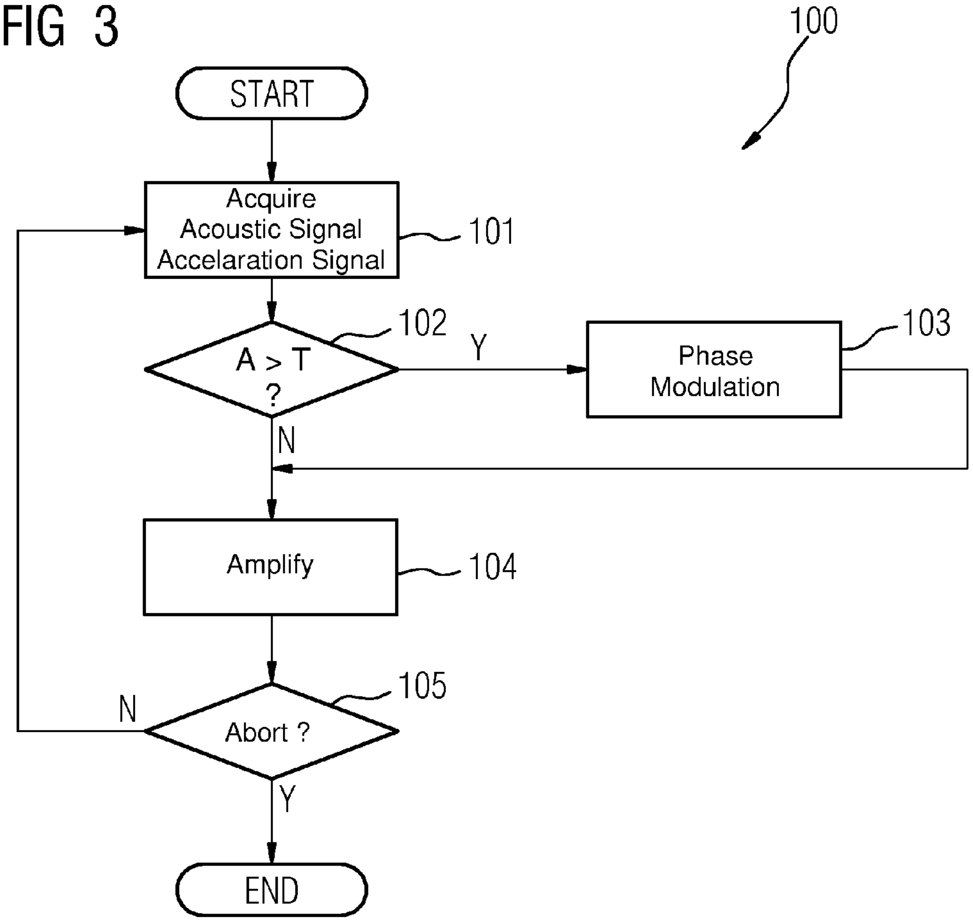
FIG. 3 is a flow chart of an exemplary embodiment of the method according to the invention.

FIG. 3 shows an exemplary embodiment of a flow chart of an inventive method 100. In the first method step 101, an acoustic signal and an acceleration value of the hearing device is detected for instance with a microphone of a hearing device. Accelerations are interpreted as head movements. In the next method step, a query 102 is carried out to determine whether the linear and/or rotatory acceleration value ("A") is greater than a threshold value ("T"). The threshold value is for instance identical to the acceleration value when the head is held still. If the query 102 is fulfilled, the detected acoustic signal in method step 103 is subjected to a phase modulation, in other words the acoustic signal is output delayed in one of the following methods steps. If the query 102 is not fulfilled, the acceleration value is therefore less than or equal to the threshold value, the phase of the detected acoustic signal is not changed. In the next method step 104, the detected acoustic signal is amplified and is output via a receiver of the hearing device when the phase modulated in the previous method step is taken into account. In the next method step, the query 105 is carried out to determine whether an abort criterion is fulfilled. The abort criterion may be for instance the switching state "off" of an on/off switch on the hearing device. Another abort criterion would be for instance a change in the operating mode of the hearing device. If the abort criterion is fulfilled the method ends, otherwise a skip is made to the first method step 101.

Figure 4:
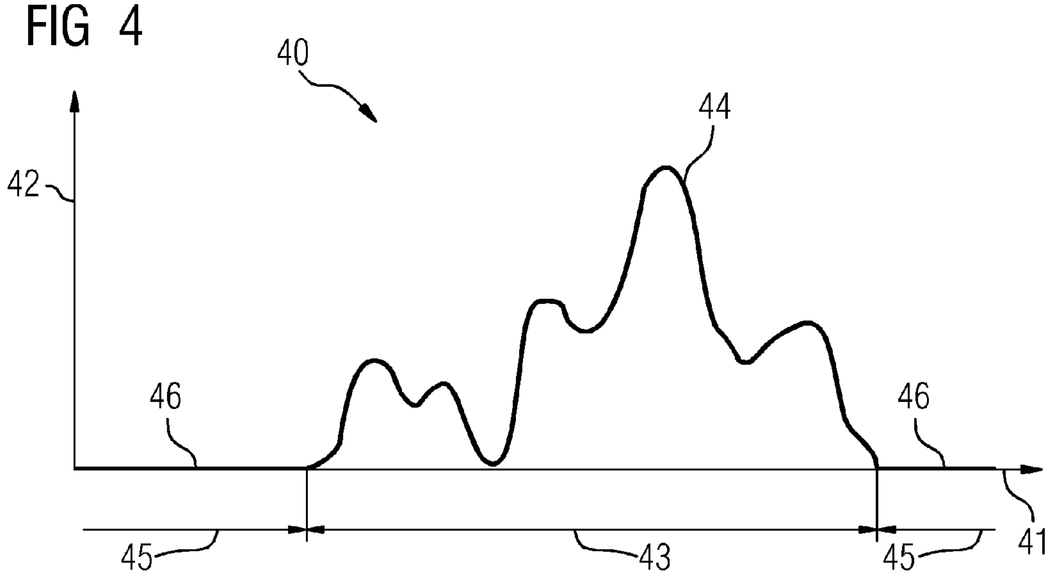
FIG. 4 is a graph showing a phase response over time according to the invention.

FIG. 4 shows an example of an inventive phase curve 40 over the time 41, e.g. in milliseconds, whereby the phase 42 is specified in milliseconds for instance. Two types of time domains are apparent in FIG. 4. During time domain 45, no head movement of the hearing device wearer is detected and thus no phase modulation is used. The phase 46 is zero in the time domains 45, i.e. no additional delay is added to the delay of the signal output which is inherently defined by the signal processing unit of the hearing device. During time domain 43, a head movement of the hearing device wearer is detected. A phase modulation, e.g. a noise function, is applied to phase 44.

Figure 5:
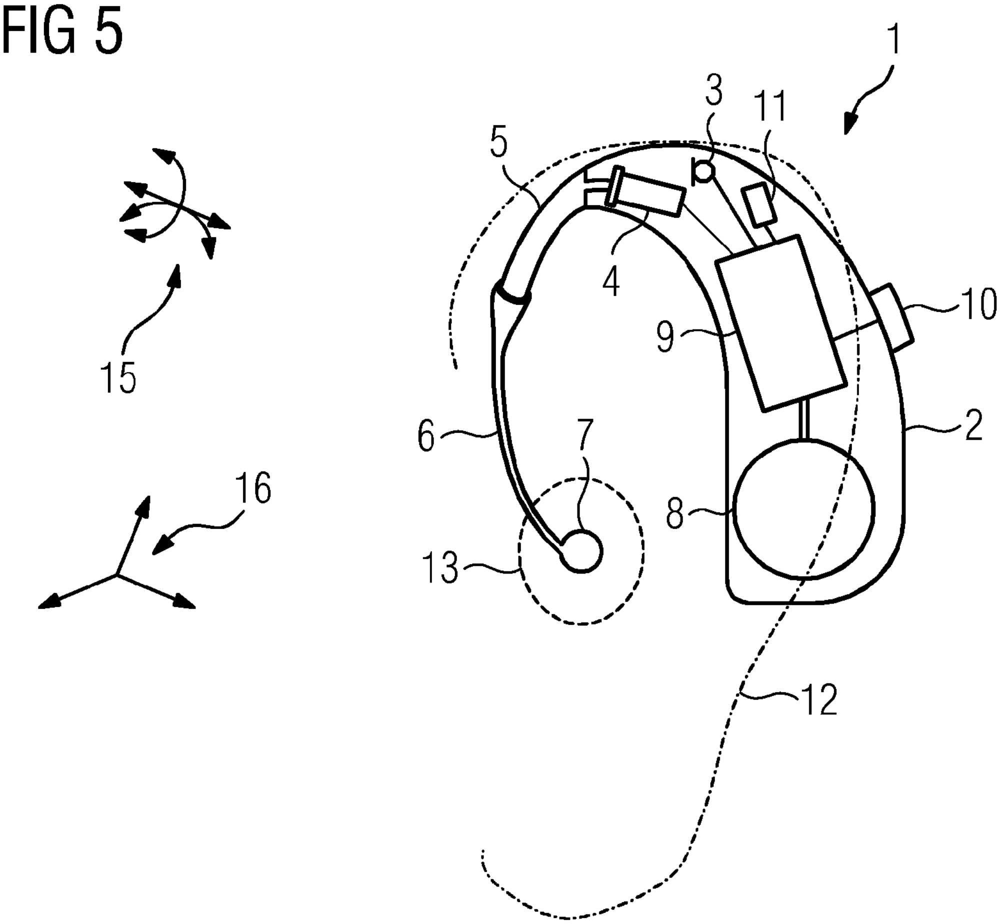
FIG. 5 is a schematic view of an exemplary embodiment of a hearing device according to the invention.

FIG. 5 finally shows a schematic representation of an exemplary embodiment of an inventive hearing device 1. It includes a housing 2 to be worn behind the auricle 12 of a hearing device wearer using a hearing device wearing hook 5. A microphone 3, a battery 8 and a receiver 4 are arranged in the housing 2 in addition to electronic components which are combined to form a signal processing unit 9. The acoustic signal generated by the receiver 4 is routed through the hearing device wearing hook 5 and a sound tube 6 to an earpiece 7, which is inserted into an auditory canal 13 of the hearing device wearer. A control element 10, e.g. an on/off switch or an operating mode regulator, is arranged on the hearing device housing 2, the latter being connected to the signal processing unit 9. In accordance with the invention, the hearing device 1 includes a motion sensor 11, which is arranged in or on the hearing device housing 2 and is exposed to the same accelerations as the head of the hearing device wearer when the hearing device 1 is being worn. The motion sensor 11 includes three acceleration sensors for instance which are aligned orthogonally with respect to one another and measure accelerations in the direction of the coordinate axis 16. Alternatively or in addition, the motion sensor 11 may include three gyro sensors, which measure angular accelerations in the directions 15.

The invention claimed is:

1. A method of operating a hearing device, the method which comprises:

detecting a head movement of a person wearing the hearing device;

upon detecting the head movement, outputting an acoustic signal acquired with a microphone in amplified and phase-modulated form with a receiver, wherein a positive correlation exists between an amplitude of the phase modulation and an output signal of a motion sensor for detecting the head movement.

2. The method according claim 1, which further comprises the following method steps:

a) detecting an acoustic signal and detecting a linear and/or rotatory acceleration value of the hearing device;

b) if the linear and/or rotatory acceleration value is greater than a threshold value, applying a phase modulation to the detected acoustic signal;

c) amplifying the detected acoustic signal and outputting the acoustic signal via a receiver; and d) if an abort criterion is not fulfilled, skipping to method step a).

3. The method according to claim 2, wherein the abort criterion is dictated by a specific switching state of a control element on the hearing device.

4. The method for operating a hearing device according to claim 1, which comprises modulating the phase with a noise function.

5. The method for operating a hearing device according to claim 1, which comprises modulating the modulated phase between 0 and 15 ms.

6. The method for operating a hearing device according to claim 1, wherein the hearing device comprises two individual hearing devices configured for binaural supply of a hearing device wearer, and the method is executed in the individual hearing devices independently of one another.

7. A hearing device, comprising:

a hearing device housing, at least one microphone for acquiring a sound signal, a receiver for outputting a sound signal, an earpiece, a power supply unit, and a signal processing unit connected to receive the sound signal from said at least one microphone;

at least one motion sensor connected to said signal processing unit and configured to detect a head movement of a wearer of the hearing device; and said signal processing unit including means for modulating a phase of an acoustic signal, said modulating means, when a head movement of the wearer of the hearing device is detected, modulating the signal acquired by the microphone, said signal processing unit amplifying the sound signal and outputting with said receiver, wherein a positive correlation exists between an amplitude of the phase modulation and an output signal of said at least one motion sensor.

8. The hearing device according to claim 7, wherein said signal processing unit is programmed to execute on the hearing device a method which comprises:

detecting a head movement of a person wearing the hearing device;

upon detecting the head movement, outputting an acoustic signal acquired with a microphone in amplified and phase-modulated form with a receiver.

9. The hearing device according to claim 7, wherein said motion sensor includes at least one acceleration sensor and/or at least one gyro sensor.

10. The hearing device according to claim 7, wherein said motion sensor includes at least two acceleration sensors and/or at least two gyro sensors, respectively disposed on non-parallel axes.

11. The hearing device according to claim 10, wherein said non-parallel axes are mutually orthogonal axes.

* * * * *